US012669859B2

(12) United States Patent
Cruise et al.

(10) Patent No.: US 12,669,859 B2
(45) Date of Patent: Jun. 30, 2026

(54) POWER-AWARE TRANSMISSION OF QUANTUM CONTROL SIGNALS

(71) Applicant: RIVERLANE LTD, Cambridge (GB)

(72) Inventors: Richard James Randon Cruise, Cambridge (GB); Robin Clive Sterling, Cambridge (GB); Marco Ghibaudi, Cambridge (GB)

(73) Assignee: RIVERLANE LTD, Cambridge (GB)

( * ) Notice: Subject to any disclaimer, the term of this patent is extended or adjusted under 35 U.S.C. 154(b) by 377 days.

(21) Appl. No.: 18/586,292

(22) Filed: Feb. 23, 2024

(65) Prior Publication Data

US 2026/0099185 A1 Apr. 9, 2026

Related U.S. Application Data

(62) Division of application No. 17/349,681, filed on Jun. 16, 2021, now Pat. No. 11,914,443.

(51) Int. Cl.
| | |
|---|---|
| *G06F 1/32* | (2019.01) |
| *G06F 13/20* | (2006.01) |
| *G06N 10/00* | (2022.01) |
| *H03M 7/30* | (2006.01) |
| *H03M 7/40* | (2006.01) |

(52) U.S. Cl.
CPC .............. *G06F 1/32* (2013.01); *G06F 13/20* (2013.01); *G06N 10/00* (2019.01); *H03M 7/6082* (2013.01); *H03M 7/40* (2013.01)

(58) Field of Classification Search
CPC .......... G06F 1/32; G06F 1/3203; G06F 13/20; G06N 10/00; G06N 10/20; G06N 10/40; G06N 10/80; G06N 20/00; H03M 7/6082; H03M 7/40; H03M 7/6047; H03M 7/70

USPC ........................................................ 716/100
See application file for complete search history.

(56) References Cited

U.S. PATENT DOCUMENTS

| | | | |
|---|---|---|---|
| 12,340,274 B2 * | 6/2025 | Rab ........................ | G06N 10/40 |
| 2023/0206104 A1 * | 6/2023 | Rab ........................ | G06N 10/00 |
| | | | 716/100 |

* cited by examiner

*Primary Examiner* — Paul Dinh
(74) *Attorney, Agent, or Firm* — Maschoff Brennan

(57) ABSTRACT

A method for transmitting control signals from a classical interface of a quantum computer to a quantum processing unit (QPU) of the quantum computer is disclosed, where the quantum computer includes a plurality of communication channels between the classical interface and the QPU. The method includes receiving, at a central processing unit (CPU) of the classical interface, a digital control signal describing a quantum circuit to be performed by the QPU; compressing, at the CPU, the digital control signal using a preselected compression scheme; generating, at the CPU, a sequence staggering configuration indicating one or more delays to be applied to transmission of the compressed digital control signal and a map indicating a number of bits to be transmitted over each of the plurality of communication channels; outputting, from the CPU to a programable logic unit of the classical interface, the compressed digital control signal, the sequence staggering configuration and the map; splitting, at the programable logic unit, the compressed digital control signal into one or more sub-streams using the map and sequence staggering configuration; and transmitting, from the programable logic unit to the QPU, the one or more sub-streams, wherein the sub-streams are transmitted with the one or more delays.

20 Claims, 9 Drawing Sheets

301    Receive static power consumption value and plurality of dynamic power consumption values 302    Determine plurality of compression schemes 303    Calculate total power consumption values 304    Select compression scheme

700

```
Descriptor format

Start byte (16 bits) - range [0-2**16-1]

Number of bytes (16 bits) - range [0, 2**16-1]

Start time of transmission (16 bits) - range [0,2**16-1]
```

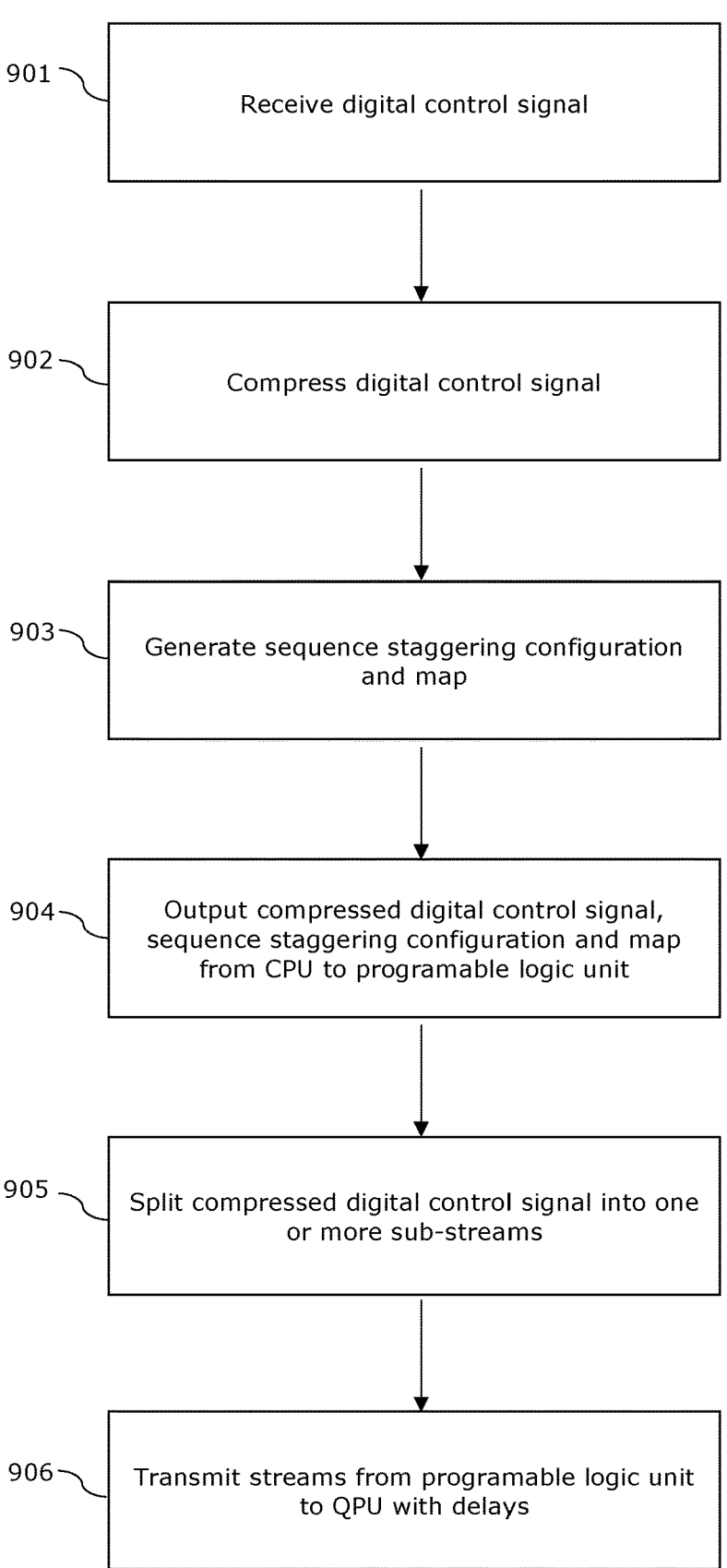

901 — Receive digital control signal

902 — Compress digital control signal

903 — Generate sequence staggering configuration and map

904 — Output compressed digital control signal, sequence staggering configuration and map from CPU to programable logic unit 905 — Split compressed digital control signal into one or more sub-streams 906 — Transmit streams from programable logic unit to QPU with delays

Fig. 9

POWER-AWARE TRANSMISSION OF QUANTUM CONTROL SIGNALS

CROSS-REFERENCE TO RELATED APPLICATIONS

This application is a divisional of U.S. patent application Ser. No. 17/349,681, filed Jun. 16, 2021, titled POWER-AWARE TRANSMISSION OF QUANTUM CONTROL SIGNALS, which is incorporated herein by reference in its entirety.

BACKGROUND

Although they have become exponentially faster over the preceding decades, the "classical" computers of today are effectively limited to solving the same classes of problems as the first digital computers developed during the mid-twentieth century.

In contrast, by exploiting the peculiarities of quantum physics, "quantum" computers promise to solve problems that are intractable on classical computers, such as factoring large numbers and simulating quantum systems.

Relatively small-scale quantum computers with noisy intermediate-scale quantum (NISQ) processors are expected to arrive in the next few years, and it is anticipated that fault-tolerant universal quantum computers with thousands of qubits could be developed within the next decade.

While quantum computers will outperform classical computers at certain tasks, for the foreseeable future quantum processors are likely to be controlled via classical interfaces which send control signals from a classical computing device to the quantum processor.

As the number of qubits in quantum computers increases, the bandwidth required to transmit these control signals to the quantum processor will also increase. However, this increase in bandwidth presents a potential problem for quantum processors. Most quantum computing architectures require the quantum processor to be maintained at cryogenic temperatures in refrigeration units that have extremely tight power constraints. The very act of transmitting control signals to the quantum process uses some of this precious power resource, with high-bandwidth control signals requiring even more power.

Even in architectures where power consumption is less of a concern, such as photonic architectures, the increased bandwidth required to transmit control signals can lead to an increase in crosstalk between communication channels, which can ultimately manifest as an increased error rate in the control signal.

Providing high communication bandwidth to quantum processors while respecting power constraints and minimising error rates is therefore a real-world obstacle to the development of scalable quantum computers.

SUMMARY

According to a first example embodiment, a method for transmitting control signals from a classical interface of a quantum computer to a quantum processing unit (QPU) of the quantum computer is disclosed. The quantum computer includes a plurality of communication channels between the classical interface and the QPU. In one example, the method receives, at a central processing unit (CPU) of the classical interface, a digital control signal describing a quantum circuit to be performed by the QPU. The digital control signal is compressed at the CPU, using a preselected compression scheme. A sequence staggering configuration is generated at the CPU, indicating one or more delays to be applied to transmission of the compressed digital control signal and a map indicating a number of bits to be transmitted over each of the plurality of communication channels. The CPU outputs to a programable logic unit of the classical interface the compressed digital control signal, the sequence staggering configuration and the map. The programable logic unit splits the compressed digital control signal into one or more sub-streams using the map and sequence staggering configuration. The programable logic unit transmits to the QPU the one or more sub-streams and the sub-streams are transmitted with the one or more delays.

The method according to the first example allows control signals to be transmitted to the QPU in in a way that respects power constraints and minimizes error rates, which in turn facilitates the development of scalable fault-tolerant universal quantum computers with thousands or more physical qubits. Using a sequence staggering configuration to transmit sub-streams with delays allows for cross-talk to be reduced on communication channels between the classical interface and the QPU, thereby reducing error rates and power consumption (as less processing is required to correct errors).

Optionally, the method may further include the step of decompressing, at the QPU, the one or more sub-streams to reconstruct the digital control signal; and, converting, at the QPU, the digital control signal into a low-level control signal for performing the quantum circuit at the QPU.

Optionally, the method may further include the step of transmitting, from the programable logic unit to QPU, reconfiguration and/or recalibration instructions. For example, the reconfiguration instructions may include an update to a Huffman table for decoding the compressed digital control signal. This allows the decoding algorithms/configurations to be dynamically updated during the lifetime of the quantum computer, e.g. depending on the task being performed by the quantum computer (for example, different tasks may involve different types of operations, which may benefit from different decoding algorithms/configurations).

Optionally, the method may further include the step of determining, at the CPU, a number of communication channels over which the compressed digital control signal is to be transmitted; and, outputting, from the CPU to programable logic unit, the number of communication channels over which the compressed digital control signal is to be transmitted.

Optionally, the preselected compression scheme is determined by performing, on a classical computing device, the steps of receiving a static power consumption value associated with the QPU and a plurality of dynamic power consumption values associated with a respective plurality of operations performable by the QPU, determining a plurality of compression schemes implementable by the QPU, and for each of the plurality of compression schemes, calculating, using the static power consumption value and the plurality of dynamic power consumption values, a total power consumption value associated with receiving and decompressing a representative control signal at the QPU using the respective compression scheme. A selecting a compression scheme having the lowest total power consumption value can then be selected.

Optionally, the operations performable by the QPU include decoding a digital 0, decoding a digital 1, reading memory, writing memory, and/or memory latches.

In one embodiment, the static power consumption value comprises memory static consumption.

In yet another optional embodiment, the a step of determining, at the classical computing device, an expected maximum uncompressed bandwidth value is performed.

In yet a further optional embodiment, the step of receiving, at the classical computing device, an indication of an amount of on-chip memory available at the QPU for decompressing the digital control signals is performed.

Optionally, the step of generating, at the classical computing device, digital logic that implements a decoder of the selected compression scheme is provided.

Optionally, the step of generating, at the classical computing device, a high-level representation of digital logic that implements a decoder of the selected compression scheme is performed.

Optionally, the step of generating, at the classical computing device, software that implements encoding logic for a central processing unit (CPU) of the classical interface and digital logic for a programmable logic unit of the classical interface is performed.

Optionally, the step of receiving, at the classical computing device, hardware details associated with the QPU is performed. The total power consumption value may be calculated based on the hardware details. The hardware details may include a number of communication channels between the classical interface and the QPU, a total number of qubits in the QPU, a distance between neighboring communication channel pins, and/or a connectivity matrix identifying a control logic location for each qubit in the QPU. In another embodiment, calculating the total power consumption value comprises computing a cost function.

Optionally, the representative control signal may include a set of circuits that are representative of a typical workload performed by the QPU. In one embodiment, the representative control signal is determined based on a respective likelihood associated with each of a set of native gates of the QPU.

Optionally, decompressing the one or more sub-streams may comprise buffering, at the QPU, at least one of the one or more sub-streams.

According to another embodiment, a quantum computing apparatus comprising a classical interface and a quantum processing unit (QPU) is disclosed. In this example, the classical interface comprises a central processing unit (CPU) and a programable logic unit, and the CPU, the programmable logic unit and the QPU are each configured to perform the steps set forth in the first example embodiment described above.

In yet another embodiment a computer readable medium comprising instructions which, when executed by a quantum computer, cause the quantum computer to perform the method described in connection with the first embodiment.

BRIEF DESCRIPTION OF THE DRAWINGS

Examples of the present invention will now be described in detail with reference to the accompanying drawings, in which:

FIG. 9 illustrates a method for transmitting control signals from a classical interface to a quantum processing unit;

DETAILED DESCRIPTION

Figure 1:
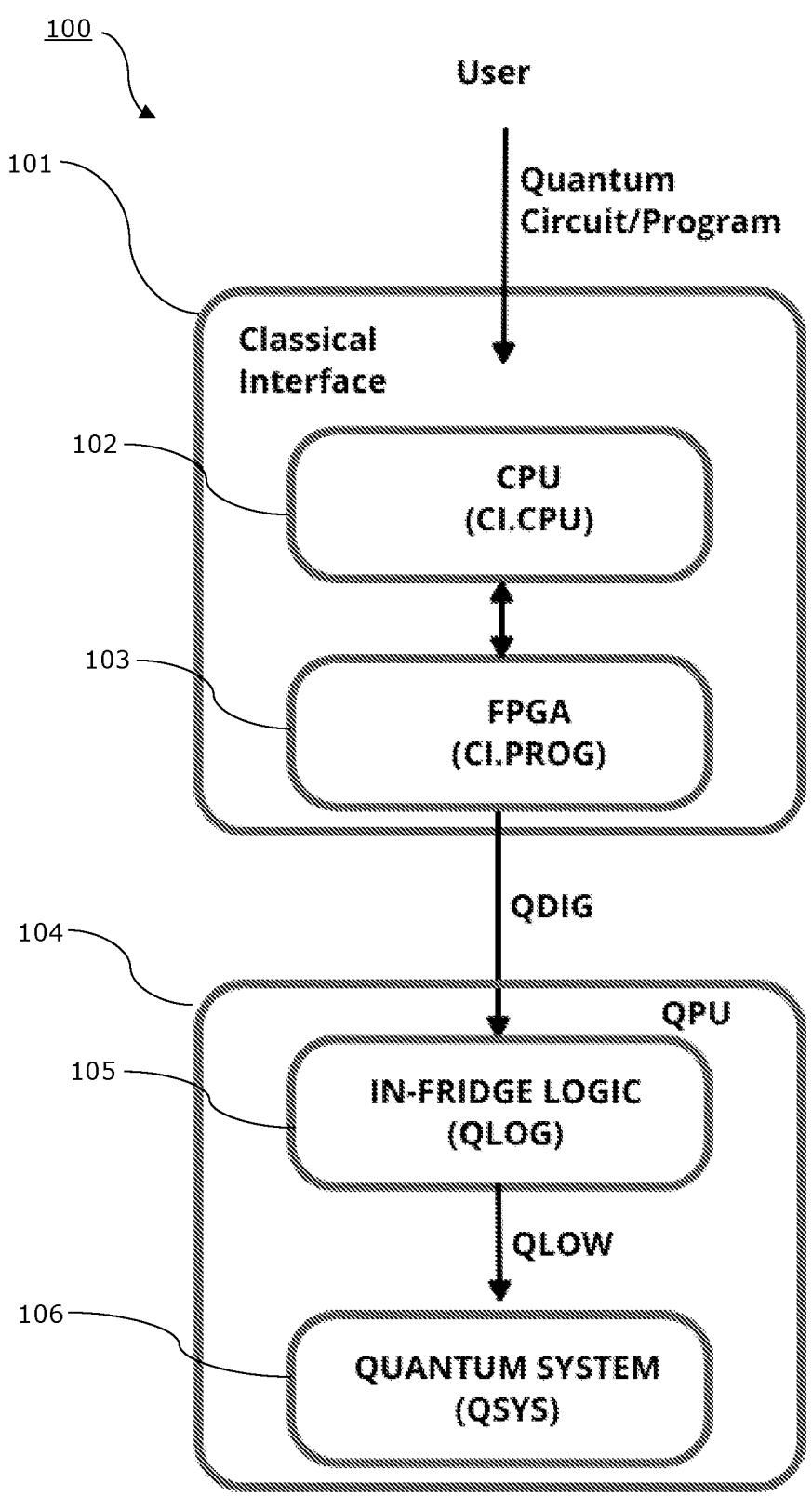
FIG. 1 illustrates in schematic form an exemplary quantum computer.

Embodiments of the present invention provide methods for transmitting control signals from a classical interface of a quantum computer to a quantum processing unit (QPU) of the quantum computer in a way that respects power constraints and minimizes error rates, thereby facilitating the development of scalable fault-tolerant universal quantum computers with thousands (or more) physical qubits.

A quantum computer is a machine that uses the properties of quantum physics to perform computations. An exemplary quantum computer 100 is illustrated in schematic form in FIG. 1. The quantum computer 100 comprises a classical interface 101 and a QPU 104. The classical interface 101 is the portion of the quantum computer 100 that handles user inputs (e.g. quantum circuits/programs) and generates and sends digital control signals (QDIG) to the QPU 104. The QPU 104 is the portion of the quantum computer 100 which manipulates qubits to create quantum states and perform quantum operations by leveraging low-level control signals (QLOW) that are generated based on the digital control signals.

The classical interface 101 comprises a classical processing unit in the form of a conventional central processing unit (CPU or CI.CPU) 102, and a classical programmable logic unit (CI.PROG) 103, which may be a field-programmable gate array (FPGA), a complex programmable logic device (CPLD), a structured application-specific integrated circuit (structed ASIC), a custom-made digital signal processor (DSP) or similar. The CPU 102 and programmable logic unit 103 are communicatively coupled to each other, e.g. directly or via a traditional bus or similar.

The QPU 104 comprises in-fridge logic (QLOG) 105 and a quantum system (QSYS) 106 with a plurality of qubits. The in-fridge logic 105 converts the digital control signals received from the classical interface 101 (more specifically, received from the programmable logic unit 103 of the classical interface 101) into the low-level control signals which are used to manipulate the qubits to perform quantum computations with the quantum system 106.

It should be noted that the quantum computer 100 illustrated in FIG. 1 is merely exemplary, and other configurations having additional components, fewer components, or functionally equivalent components are also envisaged.

The QPU may be based on any suitable quantum computing architecture, such as photonic-based, semiconducting, superconducting, ion-traps, neutral atoms etc.

The QPU must be operated in a finely tuned environment. Excluding photonic-based QPUs, all main quantum computing architectures (semiconducting, superconducting, ion-traps and neutral atoms) require extremely low operating temperatures with close to zero injected noise.

Ultra-low temperatures on the order of few K or tens of mK are reached using refrigeration units, laser cooling, sympathetic cooling or other techniques. All of these techniques have hard limits in terms of their heat dissipation capacity, and the sum of the heat generated by transmitting configurations, processing input/outputs and generating low-level control signals must be always within these heat dissipation capacities to avoid significant performance deg- radations.

Even with optimal hardware implementations, electrical noise is generally introduced in the QPU as switching noise associated with the transmission of data. An increase in noise imposes at least one of three undesirable requirements: extra computation on the receiver side to correct it, a higher signal to noise ratio to allow for clear reconstruction, and/or higher error rates in the QPU.

The QPU 104 is connected to the classical interface 101 by a fixed number of wires/communication channels over which the digital control signals are transmitted from the classical interface 101 to the QPU 104. The wires/commu- nication channels may be any suitable communication chan- nel, including e.g. electrical wires, fibre optic cables and the like. The classical interface 101 ideally instructs the QPU 104 using a continuous stream of operations in order to keep the system utilization close to 100%.

The capabilities of quantum computers are generally limited by (a) a tight power budget, (b) ultra-low latency requirements and (c) layout constraints. While (a) and (b) arise from the nature of the quantum system, (c) derives from the need to receive digital inputs via multiple wires and propagate them to logic that generates the low level control signals for each qubit.

The uncompressed bandwidth (BW) required by the streams of digital control signals transmitted from the clas- sical interface 101 to the QPU 104 is a function of:

GS: the number of quantum operations that can be executed per unit of time [Gates/sec], also known as the gate frequency;

B: the number of bits required to describe the operation [bits/gate]; and

Q: the number of qubits (and thus gates) that are involved at any single time [gate]. The total uncompressed bandwidth requirement is given by $BW=GS \times B \times Q$.

Existing semiconducting and superconducting QPUs achieve gate frequencies in excess of millions of gates per sec. With values of B commonly in excess of 16 bits per gate, and near-future qubit targets of Q>1000, the total uncompressed bandwidth required (BW) is expected to be well in excess of tens of gigabytes per second in the near future. Even quantum architectures that are characterized by slower gate speeds (e.g. ion-traps with GS=10 K Gates/sec) are expected to reach similar bandwidth requirements for Q>1,000,000, which is considered the target for fault-toler- ant quantum computers.

Generation of Compression/Decompression Logic

The present invention provides the required high com- munication bandwidth into refrigeration units while respect- ing the power constraints imposed by the refrigeration requirements.

To date, a significant amount of theoretical work has been conducted on quantum compression with the goal of com- pressing the content of operations and data in their quantum representation, i.e. reducing the number of quantum opera- tions required for a particular quantum computation rather than reducing/compressing the size of the control signals required to implement a given quantum circuit.

The present inventors have recognised that the configu- ration of the quantum machine itself (i.e. the set of digital information that upon conversion into a low-level represen- tation drives the quantum computer) can be compressed using classical processes without affecting the representa- tion/properties of the quantum data. This therefore reduces the bandwidth required by the digital control signals, thereby facilitating the transmission of more the complex digital control signals required by more powerful quantum computers with faster gate speeds and greater numbers of qubits.

Throughout the present disclosure, the terms "compres- sion scheme", "decompression scheme", "encoding scheme" and "decoding scheme" may be used interchange- ably to refer to schemes for compressing and subsequently decompressing data. Compressing the data may be referred to as "encoding", and decompressing the data may be referred to as "decoding".

The classical interface 101 that connects to the in-fridge logic of the QPU 104 has negligible constraints in terms of power consumption. This part of the quantum computer 100 can be kept within standard operating limits via active or passive dissipation components. This leads to the classical interface 101 having potentially orders of magnitude more classical computational power than the QPU 104.

Furthermore, the classical interface 101 has less-strict timing constraints, mainly because (a) users normally do not send circuits (i.e. the high-level representation of a quantum algorithm) to the quantum computer 100 in an interactive fashion, and (b) multiple circuits can be independently converted into configurations by different hardware units and sent to the QPU 104 sequentially.

In general, the in-fridge logic 105 of the QPU 104 can be extended to implement operations such as lookup table access, bit shifts and bit manipulations.

By exploiting the unique asymmetry in classical comput- ing power between the classical interface 101 and the QPU 104, an optimal compression scheme can be identified in which (a) the decoding has minimum complexity, (b) there is no dependency between two consecutive compressed streams and (c) the scheme approaches the Shannon Limit. The optimal compression scheme for a particular quantum computer will depend on the hardware configuration of that quantum computer.

Figure 2:
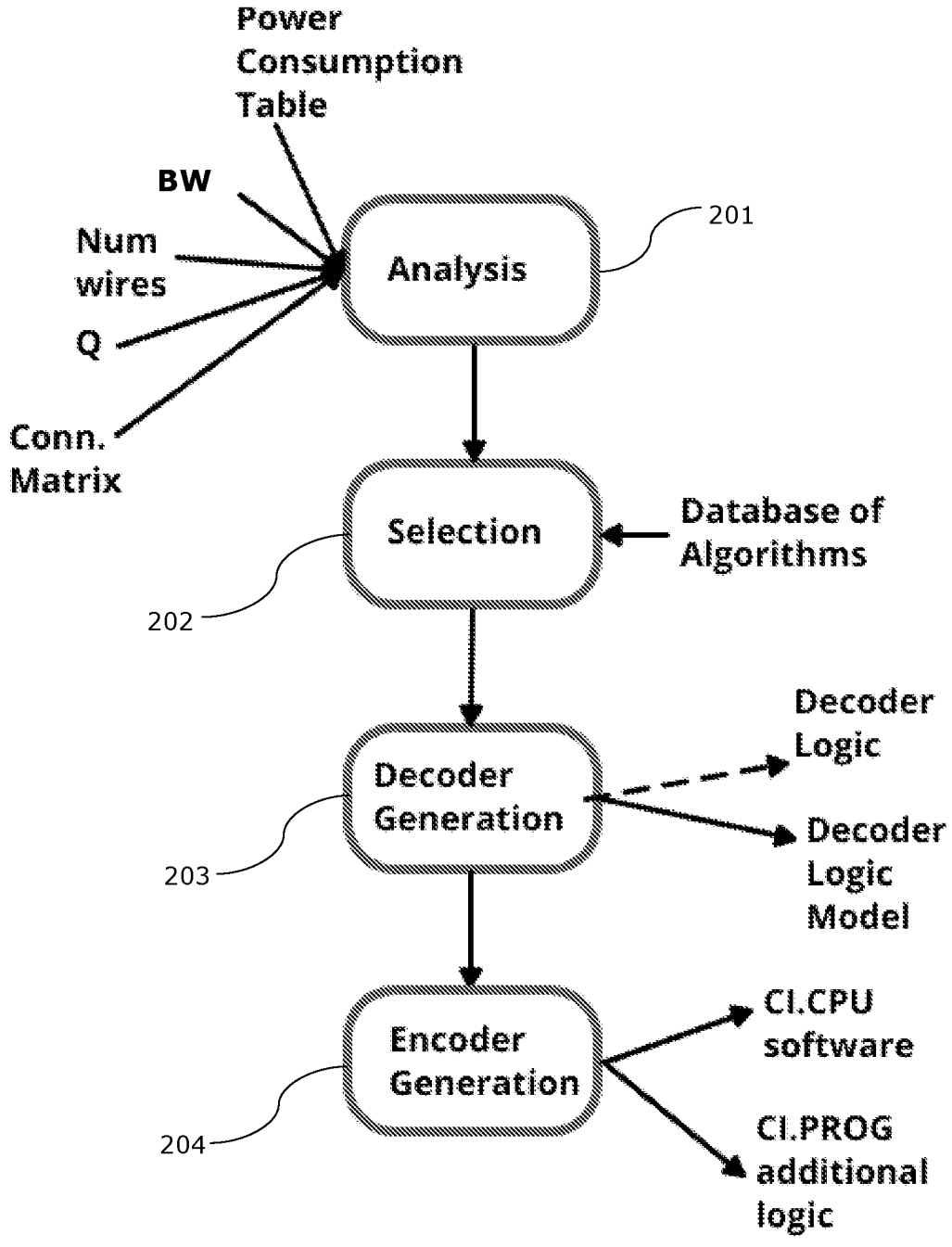
FIG. 2 illustrates steps for identifying a compression scheme.

FIG. 2 shows exemplary steps for identifying an optimal compression scheme for a quantum computer: analysis 201, selection 202, decoder generation 203 and encoder genera- tion 204. These steps are generally performed on a classical processing device before a quantum computation is per- formed. This classical processing device may be completely separate from the quantum computer and may be realised as any physical or virtual computing device such as a server, distributed computing system, or virtual server.

The analysis step 201 involves obtaining/retrieving known information regarding the quantum hardware. For example, this information may be provided directly or indirectly by the designer/manufacturer of quantum com- puter 100 and/or QPU 104, or it may be determined empiri- cally (i.e. by observation). The information may optionally be obtained/retrieved from a memory or database or similar.

During the analysis step 201, at least one static power consumption value and active/dynamic consumption values for a list of operations that can be performed by the QPU 104 are retrieved/obtained. Static power consumption is the amount of power that an electronic system (in this case the quantum computer) consumes to preserve the status of its internal signals. Dynamic power consumption is the amount of power that an electronic system consumes when a signal transitions from one logic value to another. The total power consumption of an electronic system is given by the sum of the static and dynamic power consumption values.

The list of operations for which dynamic power consumption values are obtained may include one or more of 0→1, 1→0 flip-flop transitions, memory read consumption, memory write consumption and latches consumption, and the static power consumption value may include memory static consumption.

An expected maximum uncompressed bandwidth value (BW) is also determined/obtained, along with one or more of: the number of wires in the configuration, the physical distance between pins connected to the wires, the number of qubits in the system (Q), and a connectivity matrix/map identifying the location of the control logic of each qubit. This step may additionally involve determining whether the in-fridge logic can be extended to implement reconfigurable lookup tables (i.e. whether runtime programmable/writable memories are available) and how much on-chip memory can be allocated to perform decompression tasks at the QPU 104.

The analysis step 201 may also involve obtaining/receiving a list of native gates (a predefined set of quantum instructions) and the representation of each native gate in binary format. Every quantum computer has native gate set that contains fixed instructions (such as Pauli X, Y and Z operations or similar) and parametrised instructions (such as arbitrary rotations and/or controlled gates etc.). Both fixed and parametrised instructions can be represented as collections of bits with well-defined schema and no cross-dependence among values.

During the selection step 202, the total power consumption for transmitting and decoding a statistically representative configuration is determined for a plurality of different decoding schemes. The plurality of decoding schemes may be maintained in a database or similar that contains a list of decoding schemes which respect the following conditions:

Loss-less compression;

Minimum decoding cost;

Optimality in terms of Shannon limit of the compression process;

Minimal latency; and

No cross-dependencies between portions of the compressed data.

Examples of such decoding schemes which may be contained in the database include Huffman coding (a type of lossless coding scheme that uses statistical information on the symbols to be encoded to assign them a variable length representation; most likely symbols can be coded using less bits leading to a reduction in the total amount of data to be transmitted), zero suppression (a type of coding scheme that groups large sequences of zeros into smaller symbols, allowing simple decoding and potentially high compression rates), and wavelet compression (a class of compression schemes that uses wavelet transforms to extract frequency components from the original data and leverage this information to encode them efficiently).

The details of the hardware determined during step 201 are used together with the elements of the database to generate a space of solutions, and for each solution the total power consumption is computed, e.g. using a cost function that represents the total power consumption of the QPU 104 during transmission and decompression of the digital control signals.

When determining the total power consumption, at least one control signal representative of the workload is considered. The representative control signal may be a generic control signal representative of calculations that are performed by the quantum computer 100 (e.g. it may be generated using native gate probabilities based on historical usage), or it may be associated with a particular type of calculation to be performed by the quantum computer 100 (i.e. a task-specific compression scheme may be determined using a control signal that is representative of the task).

A typical cost function C may be:

$$C = \sum_{k=0}^{GATES} \sum_{i=0}^{NLANES} (\text{SWITCH}_i(k) + MEM_i(k)) + XTALK_i(k)$$

where GATES represents a total number of native gates (e.g. in the representative control signal), NLANES represents a total number of parallel decoding logic instances, SWITCH represents a total switching-logic contribution per decoding unit, MEM represents a total memory consumption and XTALK represents noise generated by adjacent channels switching in opposite directions (e.g. the first from logical 0→1, the second from logical 1→0) transformed into a power consumption value by an appropriate coupling coefficient (which is topology dependent).

GATES is a multiset (i.e. a set with duplications) of all the gates that are of statistical relevance to computations performed on the quantum computer 100. GATES may specify a particular circuit to facilitate circuit-by-circuit optimisation (i.e. where the optimal compression scheme for a particular quantum circuit is to be determined—in this case the representative control signal is the control signal for performing the circuit that is to be performed).

Alternatively, GATES may be the multiset of native gates that are involved in a larger set of computations. In this case, GATES could potentially be determined by expanding a multiset with all the gates from one or more representative/typical circuits (i.e. circuits that are representative of a typical workload of the quantum computer 100) and optionally associating a weight to them by repeating them, e.g. {GATES_circuit1, GATES_circuit1, GATES_circuit1, GATES_circuit2}, where circuit1 is known to be more "important" than circuit2. The representative control signal may then comprise the control signal for performing these representative circuits (e.g. the control signal for performing circuit1 three times and circuit2 once).

GATES may be composed of binary codes that unequivocally define valid control sequences. These binary values must be transmitted from the classical interface 101 to the QPU 104. Depending on the hardware of the QPU 104, binary encodings can point to low-level controls (e.g. "activate laser1 at time x") or be of higher level (e.g. "DO-GATE-X"); the present invention can reduce the amount of data to be transmitted in either situation.

Once a total power value has been computed for all candidate compression schemes in the database, the compression scheme having the lowest total power value is selected as the compression scheme to use for transmitting digital control signals to the QPU 104.

In step 203, the decoder for the selected compression scheme is generated. If full details of the in-fridge logic 105 are known then the digital logic that implements the complete decoder is generated directly (e.g. a source code implementation of the decoder). Otherwise, a high-level representation/model of the digital logic may be generated when full details of the in-fridge logic are not known, and this can be used to guide the designer/manufacturer of the quantum computer 100 in implementing the decoder. Power model files may optionally also be output to enable verification of the proposed system.

In step 204, the encoder for the selected compression scheme is generated, which may involve generating the software that implements the encoding logic on the CPU 102 and additional digital logic for the programmable logic unit 103. This may include a compiled/source code implementation of the encoder to be implemented by the CPU 102 and a hardware description language (HDL) implementation of the additional logic required for the programmable logic unit 103 to implement the staggered transmission.

If the in-fridge logic 105 is not reprogrammable, the optimal compression scheme need only be determined only once (e.g. during the initial design of the QPU 104). However, if the in-fridge logic 105 is reconfigurable, selection of an optimal compression scheme can be repeated as needed to adapt to changes in requirements and the particular task to be performed.

Figure 3:
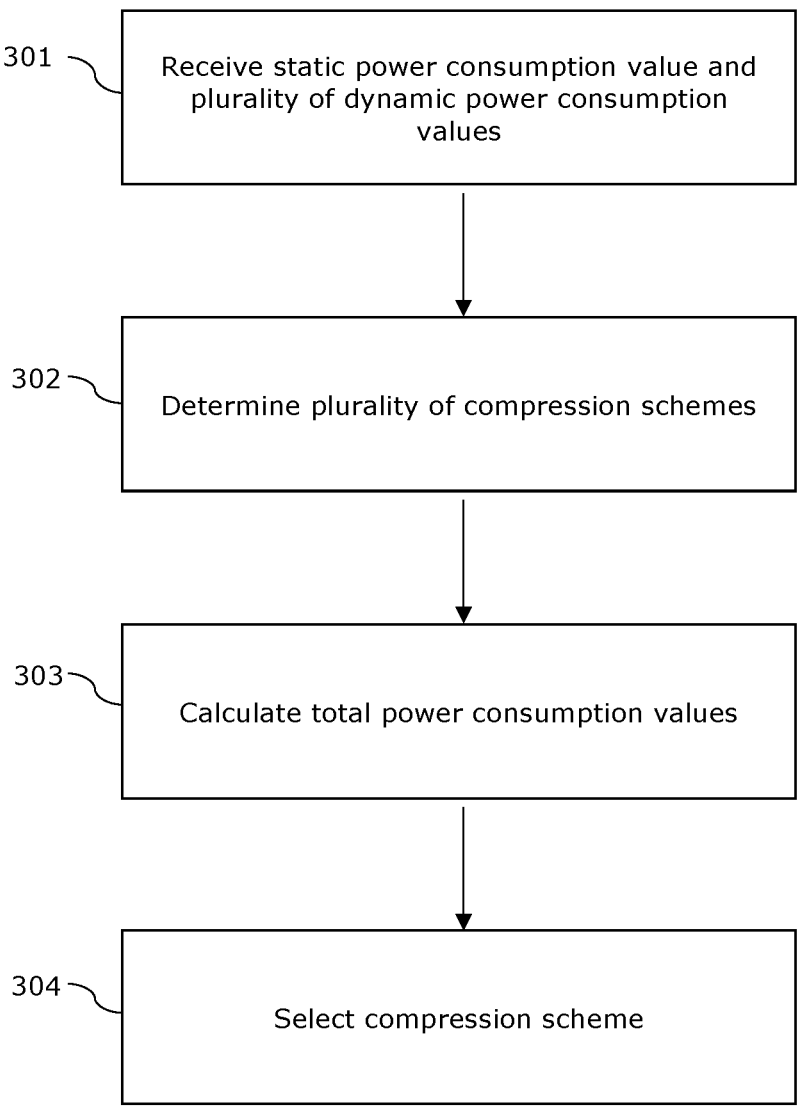
FIG. 3 illustrates a method for selecting a power-optimal compression scheme.

A computer-implemented method of selecting a power-optimal compression scheme for transmitting digital control signals from the classical interface 101 of the quantum computer 100 to the QPU 104 are shown in FIG. 3. This method corresponds to the steps shown in FIG. 2 and described above.

In step 301, a computing device (e.g. a classical computing device) receives at least one static power consumption value and a plurality of dynamic power consumption values associated with a respective plurality of operations performable by the QPU. These power consumption values may be provided directly or indirectly by the designer of the of the quantum computer 100/QPU 104, or they may be determined empirically (e.g. by another party). They may also be retrieved from a database/memory or similar.

In step 302, the computing device determines a plurality of compression schemes that can be implemented by the quantum computer. These schemes may be selected from a database of known compression schemes, and schemes that are implementable by the quantum computer may be determined based on e.g. whether the in-fridge logic 105 is capable of implementing reconfigurable lookup tables and how much on-chip memory is available for performing decompression.

In step 303, total power consumption values associated with receiving and decompressing a representative control signal at the QPU are determined for each of the plurality of compression schemes using the static power consumption value and the plurality of dynamic power consumption values. For example, these values may be determined using a cost function with a representative control signal (e.g. based on a set of circuits that are representative of a typical workload performed by the QPU and/or based on a respective probability of each of a set of native gates performable by the QPU occurring during an arbitrary computation/historical calculations).

In step 304, the compression scheme having the lowest total power consumption value is selected. Digital logic (or a high level representation thereof) of the decoder associated with the compression scheme may then be output along with software that implements encoding logic for the CPU 102 and digital logic for the programmable logic unit 103.

The method illustrated in FIG. 3 may be performed by any suitable data processing apparatus, although it is particularly suitable to apparatuses having classical processors.

The resulting compression scheme allows control signals to be transmitted to the QPU 104 with reduced power consumption by the QPU 104 (because the compressed control signal requires less power to transmit than an uncompressed signal, and the compression scheme has been chosen to minimise power consumption by the QPU 104)

and reduced error rates (because the compressed control signal reduces crosstalk), thereby leading to the quantum computer 100 operating more efficiently and facilitating the production of more powerful quantum computers with more qubits. The benefits of this method occur at the architecture level of the quantum computer 100, i.e. the advantageous effects (reduced power consumption and reduced noise in control signals) are produced irrespective of the data being processed/the quantum computation being performed.

While it is known in classical computing to use compression schemes per se in the transmission of data, none of these classical uses can be considered analogous to the above method.

For example, satellite communications occur over a very noisy communication channel and have a receiver that operates at low power, but there is generally only a single channel (equivalent to one wire between the classical interface 101 and the QPU 104) as there is little gain from using multiple channels.

Likewise, while Internet of Things (IoT) devices have noisy channels and strict power constraints, the channels are generally symmetric and so the transmission encoding energy cost plays a significant role as well as the decoding energy. This means that for node-to-node connections "lighter" symmetric compression schemes are generally utilised rather than potentially wasting power on schemes in which the encoding stage is more complicated.

Classical memories and central processing devices are an example of multi-channel communications. However, this communication is bidirectional and balanced.

Existing scenarios (i.e. classical computing scenarios in which compression schemes are utilised to transmit data) therefore do not provide a suitable solution for compressing the digital control signals used for quantum computation. Rather than using standard compression schemes (i.e. with one channel or in which the communication is bidirectional and balanced), the present inventors have instead formulated the above method by recognising (and taking advantage of) the multiple wires/communication channels between the classical interface 101 and the QPU 104 and the asymmetry between the encoding power of the CPU 102 and the decoding power of the QPU 104.

The resulting method reduces the bandwidth close to the Shannon limit whilst injecting the minimum amount of noise possible into the QPU 104.

Power-Aware Transmission

Figure 4:
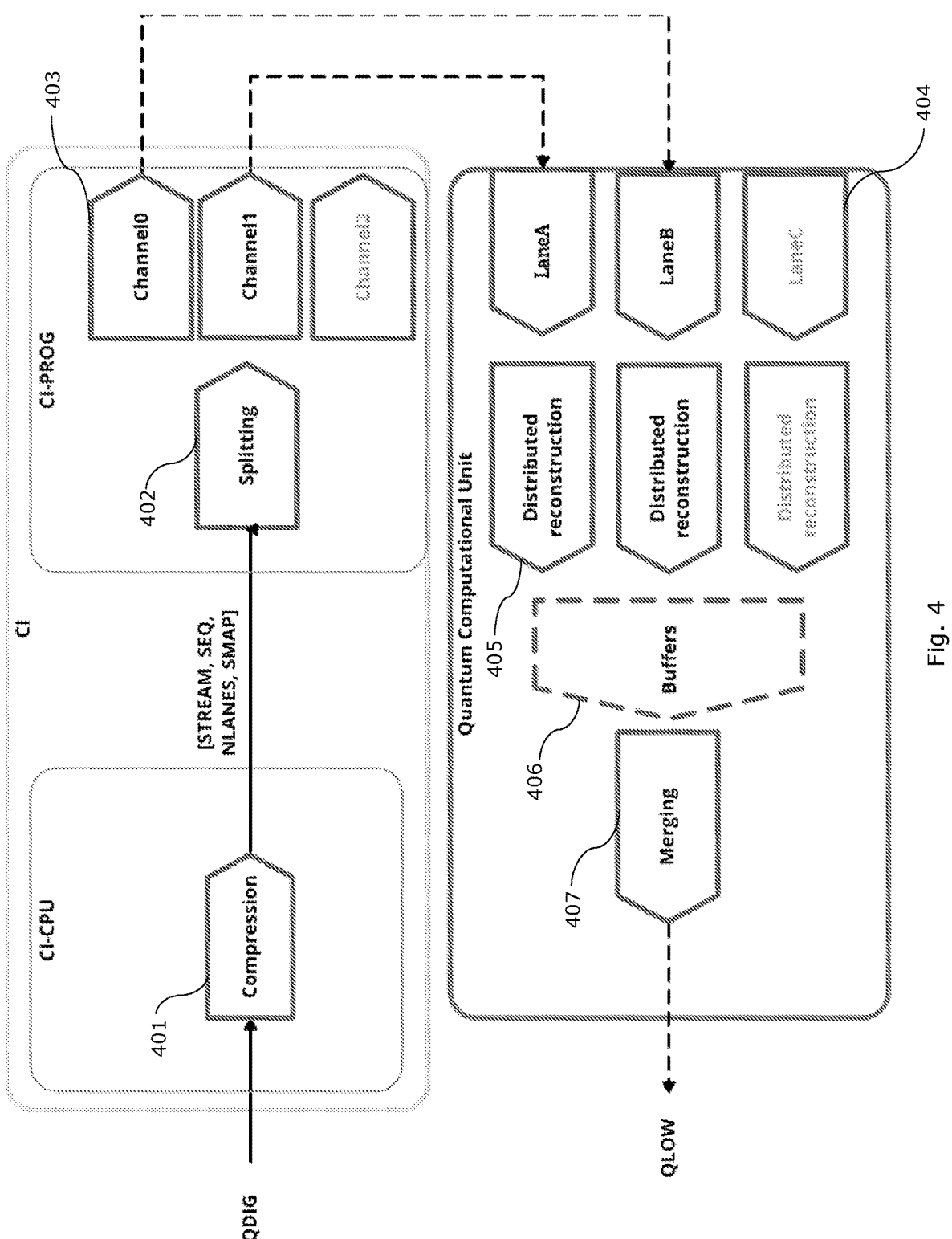
FIG. 4 illustrates steps for transmitting a compressed digital control signal.

Once the power-optimal compression scheme has been determined, it can be used to transmit compressed digital control signals from the classical interface 101 to the QPU 104 as shown in FIG. 4.

In existing solutions, upon receipt of a sequence of high-level operations (circuit) from a user, the classical interface 101 generates a sequence of digital control signals. The digital control signals are generally transmitted with no compression and converted by the in-fridge logic 105 to low-level control signals by simple digital-to-analogue transformations. This means that existing solutions require an increased number of wires to transmit data to cope with higher bandwidth requirements, which in turn increases electrical noise introduced in the system and could potentially prevent quantum processors from reaching high utilisation.

The present inventors overcome this by compressing the digital control signal stream in a power aware fashion, thus reducing total power consumption and enabling fewer wires to be used when transmitting control signals. Reducing power consumption in this way means that the power constraints of the in-fridge logic can be adhered to, thereby resulting in the quantum computer 100 running more efficiently and effectively and facilitating the production of large-scale quantum computers.

Furthermore, the power aware transmission method is agnostic to the computation being performed (i.e. the benefits of the method do not depend on the computation/task being performed by the quantum computer) and operates at the architecture level of the quantum computer. Moreover, as will be explained in more detail below, the method involves transmitting sub-streams with one or more delays in order to reduce crosstalk and thereby reduce error rates, which further enhances power efficiency (because less energy is required to correct errors).

The power-aware transmission procedure involves four main stages: compression 401, splitting 402, distributed reconstruction 405, and merging 407. The following description will use the term "lane" to indicate a portion/sub-stream of a compressed stream of bits and "channel" to indicate any of the wires that connects the programmable logic unit 103 to the QPU 104.

During the compression stage 401, the full list of digital control signals that describes a circuit is fed into the encoder (i.e. the encoder of the compression scheme obtained using the method described earlier). Compression of the digital control signal is performed by the CPU 102, which generates a loss-less, compressed representation of the initial data (STREAM), a sequencing staggering configuration (SEQ), the number of lanes required (NLANES) and a map (SMAP) of the channel index (CH_IDX) and the number of bits to be transmitted over that channel (NBIT_CH). These outputs are passed to the programmable logic unit 103 logic via a standard communication link.

As mentioned above, STREAM is the compressed representation of the digital control signal.

The sequence staggering configuration SEQ is a sequence order that instructs the programmable logic unit 103 how to transmit the portions (lanes) of the STREAM to the QPU 104. The sequence staggering configuration contains the starting order as well as the delays to be applied by each channel.

NLANES is the number of lanes used to transmit the specific STREAM (for some digital control signals, NLANES may be chosen to be lower than the number of available physical channels in order to reduce the total power consumption—this will depend on the configuration of the quantum hardware and the digital control signal).

SMAP is a map that defines the binding between the channel index CH_IDX and the number of bits to be transmitted over that channel NBIT_CH (in other words, the relative number of bits that each channel is to transmit).

Figure 5:
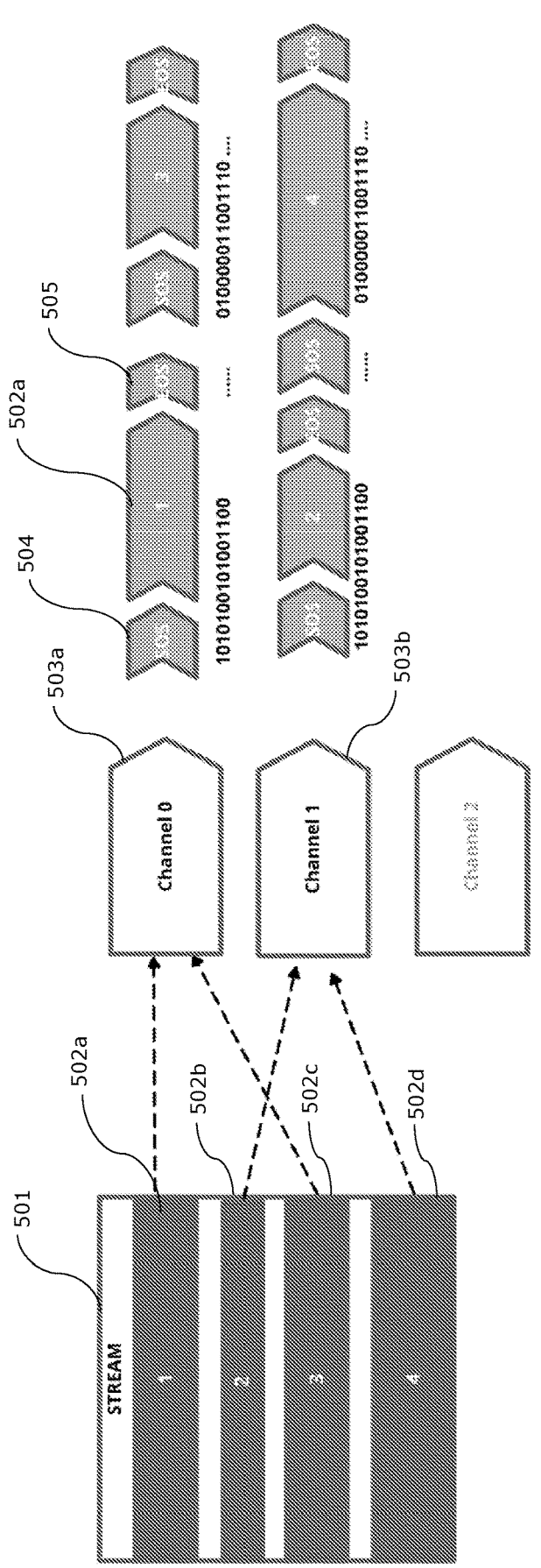
FIG. 5 illustrates a steps for splitting a compressed digital control signal.

During the splitting stage 402, the programmable logic unit 103 receives the outputs generated by the CPU 102 and uses the sequence staggering configuration to split and transmit the various portions 404 of the STREAM over the channels 403. The sequence staggering configuration indicates a delay to apply to the transmission of a specific portion 404 of the STREAM over the corresponding channel 403 in terms of bits. This process in shown in FIG. 5, in which a STREAM 501 has four portions/sections 502*a-d* that are transmitted over two channels 503*a* and 503*b*. During each transmission, the channels insert "start-of-stream" and "end-of-stream" indicators 504 and 505 respectively to indicate that they are transmitting. Idle channels preferably do not generate any value, i.e. their output is kept at logical '0' or '1' (as selected by the encoding scheme).

The combination of staggered transmissions over the channels (achieved via the sequence staggering configuration) and variable lane size (implemented via SMAP) allows cross-talk and total noise to be minimised for a user provided circuit.

Figures 7, 8:
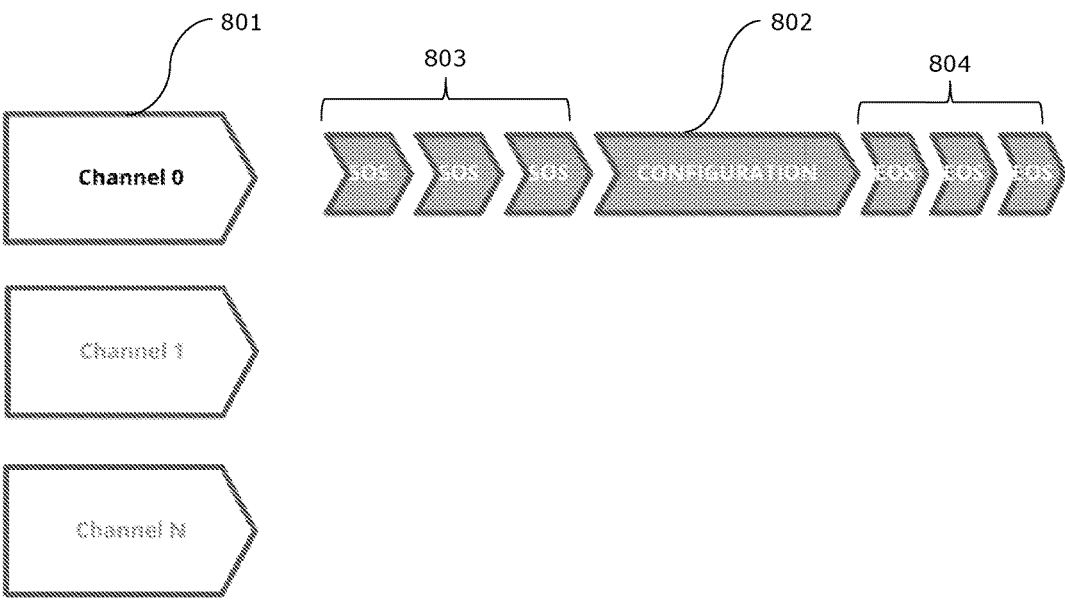
FIG. 7 illustrates an exemplary descriptor/header for use in transmitting a compressed digital control signal.
FIG. 8 illustrates steps for sending reconfiguration information to a quantum processing unit.

Descriptors/headers 700, such as shown in FIG. 7, may be used to provide information on the portion/sub-stream of the STREAM each channel transmits (for some digital control sequences, channels may be required to transmit different size portions of the STREAM in order to minimize decoding/decompression power consumption—this will depend on the configuration of the quantum hardware and the digital control signal).

As shown in FIG. 8, one of the channels (e.g. channel 0 801) may optionally transmit extra information to the QPU 104 to perform reconfiguration or calibrations (e.g. an update to the Huffman tables). In this situation, all other channels are preferably kept idle and specific SOS and EOS sequences 803 and 804 are transmitted before and after the updated configuration 802 to indicate that the transmission contains reconfiguration or calibrations instructions.

During the distributed reconstruction stage 403, the in-fridge logic 105 receives the portions of the STREAM and parses them via NLANES parallel blocks. Each parallel block reconstructs part of the original STREAM, i.e. each involved/active channel performs decompression of its respective portion of the STREAM. This process has deterministic latency known at design time (i.e. the decoding latency of the parallel blocks of logic is fully deterministic).

Finally, during the merging stage 404, the decompressed streams are forwarded to the merging logic of the QPU 104 (e.g. a central unit in the in-fridge logic 105) that combines the various parts of the STREAM to reconstruct the original uncompressed digital control signal. Depending on the selected compression scheme, the method may optionally involve buffering the channels outputs using a buffer 406 to improve throughput, while other compression scheme may instead rely only on the staggering of the transmissions without using a buffer.

The merging logic merges then passes the reconstructed digital control signal to analogue conversion logic (e.g. a digital-to-analogue convertor DAC) for conversion into low-level control signals to drive the quantum system 106.

Figure 6:
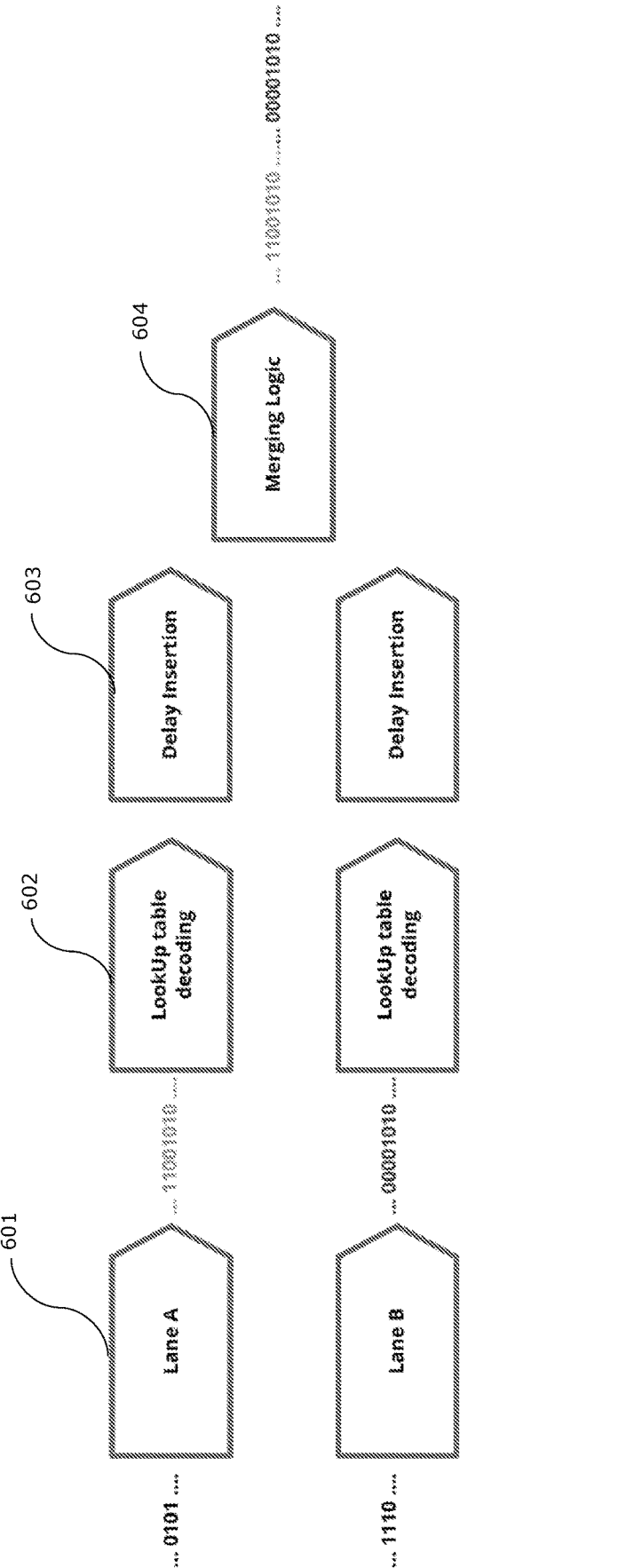
FIG. 6 illustrates steps for reconstructing and merging a compressed digital control signal.

Exemplary distributed reconstruction and merging stages are shown in more detail in FIG. 6. For each lane 601, the compressed signal is decoded 602 using a lookup table and delays are inserted 603 as appropriate. The merging logic 604 then reconstructs the original uncompressed digital control signal.

A method for transmitting control signals from the classical interface 101 of a quantum computer 100 to the QPU 104 of the quantum computer 100 is shown in FIG. 9. This method corresponds to the stages 401-404 described above.

In step 901, a digital control signal describing a quantum circuit to be performed by the QPU 104 is received at the CPU 101. This digital control signal is uncompressed and may represent a computation or task to be performed by the quantum computer.

At step 902, the (uncompressed) digital control signal is compressed by the CPU using a preselected compression scheme (e.g. a power-optimal compression scheme determined using the method shown in FIG. 3) to generate the compressed digital control signal (STREAM).

At step 903, the CPU generates the sequence stagging configuration (SEQ) indicating one or more delays to be applied to transmission of the compressed digital control signal, and it also generates the map (SMAP) indicating the number of bits to be transmitted over each of the plurality of communication channels between the classical interface 101 and the QPU 104 (more specifically, between the programmable logic unit 103 and the in-fridge logic 105).

At step 904, the CPU outputs the compressed digital control signal, the sequence staggering configuration and the map to the programable logic unit 104.

At step 905, the programmable logic unit splits the compressed digital control signal into one or more sub-streams (i.e. on or more portions of STREAM). These sub-streams may also be referred to as portions/sections/parts/lanes of the compressed digital control signal (STREAM).

At step 906, the sub-streams are transmitted from the programable logic unit 103 to the QPU 104 with the one or more delays.

Once the QPU 104 receives the sub-streams, it can decompress the sub-streams to reconstruct the (uncompressed) digital control signal (i.e. using the in-fridge logic 105) and convert the digital control signal into a low-level control signal (e.g. an analogue control signal) and perform the quantum circuit at the QPU 104 (i.e. using the quantum system 106).

The method shown in FIG. 9 is performed independently for each quantum circuit to be transmitted to the QPU 104 (i.e. for every computation/task).

EXAMPLE

An example of using the earlier methods to select a power-optimal compression scheme and transmit a control signal using the selected compression scheme will now be described in detail.

First, the designer of the quantum computer provides details of the total bandwidth (BW), the number of inputs (i.e. the number of wires/fibres that enter into the GPU), the power consumption for memory operations (read and write), power consumption for decoding a digital '0', power consumption for decoding a digital '1', distance between neighboring pins, and a table containing the encoding for the all standard gates and their likelihood.

Next, a database of algorithms is used to identify candidate compression scheme (i.e. those that are implementable by the QPU 104) and create multiple scenarios (each scenario having a different compression scheme). For each scenario, the compression rate, the number of memory accesses and logic operations required are identified. Using these parameters, the total transmission power consumption plus the decoding power consumption is computed.

For illustration, consider an example costing for a Huffman Coding implementation assuming the following parameters:

Memory operation power consumption (1 access at 100 MHz): 70 nW

Logic operations (e.g. bitshift) power consumption: 30 nW

I/O power consumption (per pin) per 1 bit transmitted (at 100 MHz): 50 nW

Number of inputs: 16

Total number of gates to be transmitted: 64

Date requirement of gate: 64 bits per gate

The 4 most likely gates make up more than 97% of transmission requirement

Cross-talk model for I/O pins: only neighbor pins have a not-negligible cross-talk.

It is also assumed that by using Huffman Coding the most likely gates are compressed into a 4 bit representation. This is a compression rate 1/16 and the other gates on average compress to 62 bits (rate 62/64). Therefore, by using Huffman Coding scheme and considering the distribution of the symbols, the total compression rate is given by:

$$0.87 \times \frac{1}{16} + 0.03 \times 62/64 \approx 0.09.$$

The resulting power consumption to transmit and decode 1000 gates is approximately 390 μW (0.09×1000 gates×64 bits/gate×50 nW+1000×70 nW) versus a 3200 μW for the uncompressed transmission. Assuming that the gain, ~×10, is the best achievable among the scenarios, this compression scheme can be selected as the optimal compression scheme. The Encoder Logic for the CPU 102 is then Generated. This Logic Contains:

The logic to extract the distribution of symbols from a circuit (Huffman table generation/update—the Huffman table is the mapping between symbols and representation used by an encoding scheme, and it can either be generated on the fly by the encoding logic and transmitted to the decoding logic (update process) or a-priori assigned a fixed value at start of activities).

The logic to convert the digital control signals into a compressed form using the Huffman table.

The logic that identifies the optimal number of lanes and sequencing to use to transmit the compressed stream in order to minimise the total active power consumption.

The splitting logic for the programmable logic unit 103 is also produced, which comprises:

The lane assignment logic.

The staggering start logic and the required synchronization logic (required if multiple CI-PROG are involved).

The Following is Also Provided to the Designer of the Quantum Computer 100:

A high-level description of the logic to be implemented via in-fridge logic (QLOG).

A model of the QLOG behaviour and where possible power constraint files to characterize the expected consumption of the logic.

The designer of the quantum computer can test on a classical machine that the compression/decompression scheme operates as expected.

The selected compression scheme can then be used to transmit digital control signals. First, a user generates a quantum circuit that is compiled into a digital control signal, and this is fed to the compression logic of the CPU 102. In this example, it is assumed that no update to the Huffman tables is performed and that pre-defined values are used (these values may have been generated when the quantum computer was designed may be or computed daily on the basis of all digital control signal inputs received by the classical interface 101.

The compression logic then uses the digital control signal to generate STREAM, SEQ, NLANES and SMAP as described above. For simplicity, it will be assumed in this example that the compression logic identifies an optimal solution for the provided digital control signal having NLANES=4 and a sequence SEQ in which adjacent channels are never transmitting at the same time, e.g. odd channels only followed by even channels. The optimal SMAP in this example has all the channels transmitting the same amount of data, i.e. the STREAM is equally split across the various channels.

A first odd channel (e.g. channel 1) may start the transmission followed by a second odd channel (e.g. channel 3). The transmission from channel 3 is staggered with respect to the transmission from channel 1 by a number of bits equal to the reconstruction latency of channel to guarantee the correct reconstruction order.

Even channels (e.g. channel 2 and channel 4) can then transmit the second portion of the STREAM, with channel 1 and channel 3 going idle. In this example, the encoding logic in the CPU 102 may have identified that this specific pair offers better noise-rejection due to a different XTALK coupling value and that the second part of compressed STREAM would benefit from this. As per the previous step, the decoding is staggered, and the digital control signal is then reconstructed in a streaming fashion.

Data Processing Apparatus

Figure 10:
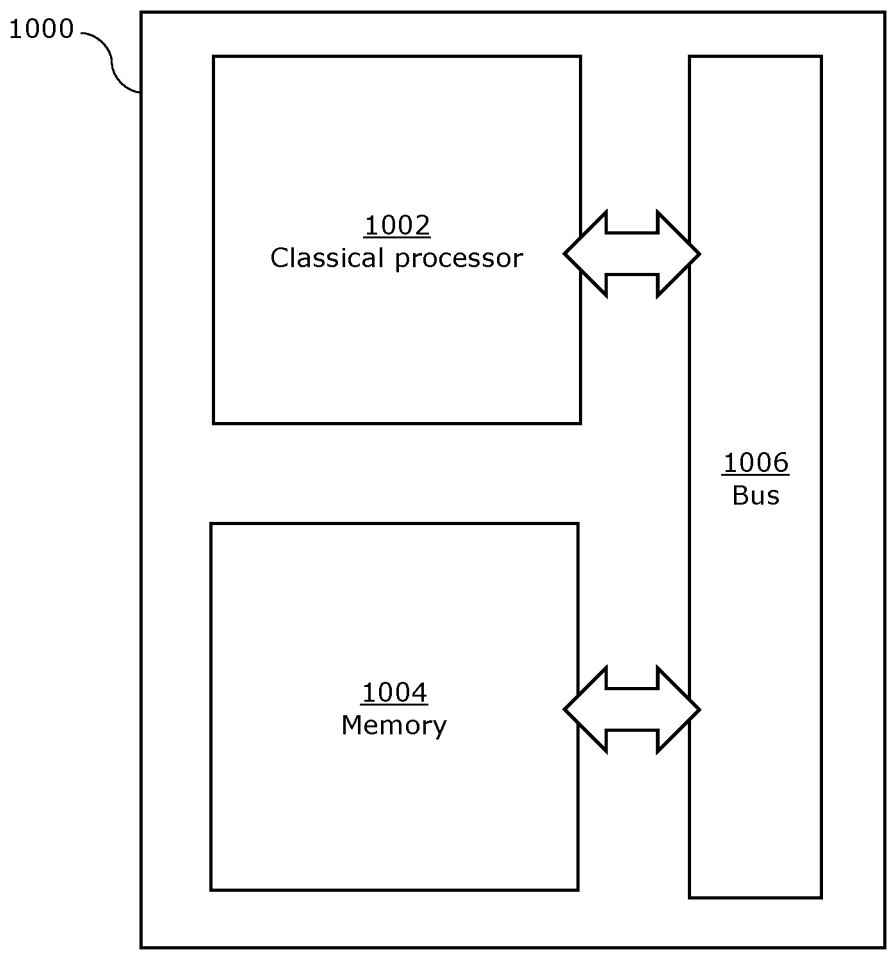
FIG. 10 illustrates in schematic form a data processing apparatus.

While the power-optimal compression scheme could be determined by the classical interface, it is envisaged that it will generally be determined by a separate (classical) data processing apparatus such as the data processing apparatus 1000 shown in FIG. 10. The data processing apparatus may comprise a classical processor 1002 (such as a central processing unit) and a (classical) memory 1004 in communication with the classical processor 1002 via a bus 1006.

The data processing apparatus 1000 may further comprise additional unillustrated components, such as a communication interface for communicating with other (classical or quantum) computing devices via a network such as the Internet and/or a local area network (LAN). Other optional unillustrated components may include a storage device and user input/output/display devices (such as keyboards, mice, monitors etc.).

The data processing apparatus 1000 could be any suitable virtual or physical computing device, such as a server, a desktop computer, a virtual server etc. The data processing apparatus 1000 could also be a distributed network of multiple computing devices.

The data processing apparatus 1000 may optionally be employed as part of a system comprising the data processing apparatus 1000 in communication with a quantum computer 100 of FIG. 1.

Computer Readable Medium

Figure 11:
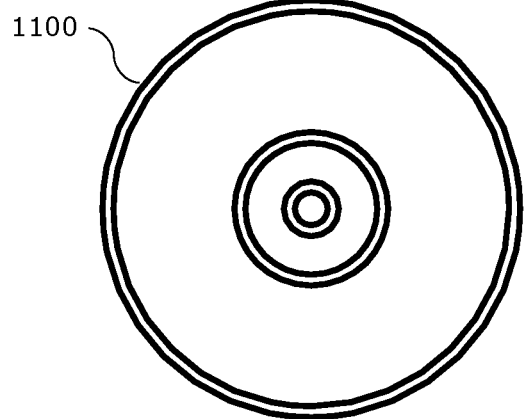
FIG. 11 illustrates a computer readable medium.

All or some of the steps of any of the disclosed methods could be provided as instructions on a (non-transitory) computer readable medium, such as the computer readable medium 1100 shown in FIG. 11. These instructions may cause classical and/or quantum processors to perform the method steps as appropriate.

While the illustrated computer readable medium 1100 is a disc (such as a compact disc, digital versatile disk, Blu-ray or similar), alternative media formats may also be used such as flash storage, cloud storage etc.

In all of the above examples, it should be understood that any method could include additional steps, and any device could include additional components. In addition, unless indicated otherwise or technically infeasible, the method steps may be performed in alternative orders, and the order described above should be considered as exemplary rather than limiting.

The invention claimed is:

1. A method for transmitting control signals from a classical interface of a quantum computer to a quantum processing unit (QPU) of the quantum computer, the quantum computer comprising a plurality of communication channels between the classical interface and the QPU, the method comprising:

receiving, at a central processing unit (CPU) of the classical interface, a digital control signal describing a quantum circuit to be performed by the QPU;

compressing, at the CPU, the digital control signal using a preselected compression scheme;

generating, at the CPU, a sequence staggering configuration indicating one or more delays to be applied to transmission of the compressed digital control signal and a map indicating a number of bits to be transmitted over each of the plurality of communication channels;

outputting, from the CPU to a programable logic unit of the classical interface, the compressed digital control signal, the sequence staggering configuration and the map;

splitting, at the programable logic unit, the compressed digital control signal into one or more sub-streams using the map and sequence staggering configuration; and, transmitting, from the programable logic unit to the QPU, the one or more sub-streams, wherein the sub-streams are transmitted with the one or more delays.

2. The method of claim 1, further comprising:

decompressing, at the QPU, the one or more sub-streams to reconstruct the digital control signal; and, converting, at the QPU, the digital control signal into a low-level control signal for performing the quantum circuit at the QPU.

3. The method of claim 1, further comprising transmitting, from the programable logic unit to the QPU, reconfiguration and/or recalibration instructions.

4. The method of claim 1, further comprising:

determining, at the CPU, a number of communication channels over which the compressed digital control signal is to be transmitted; and, outputting, from the CPU to programable logic unit, the number of communication channels over which the compressed digital control signal is to be transmitted.

5. The method of claim 1, wherein the preselected compression scheme is determined by performing the following steps on a classical computing device:

receiving a static power consumption value associated with the QPU and a plurality of dynamic power consumption values associated with a respective plurality of operations performable by the QPU;

determining a plurality of compression schemes implementable by the QPU;

for each of the plurality of compression schemes, calculating, using the static power consumption value and the plurality of dynamic power consumption values, a total power consumption value associated with receiving and decompressing a representative control signal at the QPU using the respective compression scheme; and, selecting a compression scheme of the plurality of compression schemes having the lowest total power consumption value.

6. The method of claim 5, where the operations performable by the QPU comprise decoding a digital 0, decoding a digital 1, reading memory, writing memory, and/or memory latches.

7. The method of claim 5, wherein the static power consumption value comprises memory static consumption.

8. The method of claim 5, further comprising determining, at the classical computing device, an expected maximum uncompressed bandwidth value.

9. The method of claim 5, further comprising receiving, at the classical computing device, an indication of an amount of on-chip memory available at the QPU for decompressing the digital control signals.

10. The method of claim 5, further comprising generating, at the classical computing device, digital logic that implements a decoder of the selected compression scheme.

11. The method of claim 5, further comprising generating, at the classical computing device, a high-level representation of digital logic that implements a decoder of the selected compression scheme.

12. The method of claim 5, further comprising generating, at the classical computing device, software that implements encoding logic for a central processing unit (CPU) of the classical interface and digital logic for a programmable logic unit of the classical interface.

13. The method of claim 5, further comprising receiving, at the classical computing device, hardware details associated with the QPU, wherein the total power consumption value is calculated based on the hardware details.

14. The method of claim 5, wherein the hardware details comprise a number of communication channels between the classical interface and the QPU, a total number of qubits in the QPU, a distance between neighboring communication channel pins, and/or a connectivity matrix identifying a control logic location for each qubit in the QPU.

15. The method of claim 5, wherein the representative control signal comprises a set of circuits that are representative of a typical workload performed by the QPU.

16. The method of claim 5, wherein the representative control signal is determined based on a respective likelihood associated with each of a set of native gates of the QPU.

17. The method of claim 5, wherein calculating the total power consumption value comprises computing a cost function.

18. The method of claim 1, where decompressing the one or more sub-streams comprises buffering, at the QPU, at least one of the one or more sub-streams.

19. A quantum computing apparatus comprising a classical interface and a quantum processing unit (QPU), wherein the classical interface comprises a central processing unit (CPU) and a programable logic unit,
    wherein the CPU is configured to:

receive a digital control signal describing a quantum circuit to be performed by the QPU;
    compress the digital control signal using a preselected compression scheme;
    generate a sequence staggering configuration indicating one or more delays to be applied to transmission of the compressed digital control signal and a map indicating a number of bits to be transmitted over each of the plurality of communication channels; and
    output, to the programable logic unit, the compressed digital control signal, the sequence staggering configuration and the map,
and wherein the programable logic unit is configured to:
    split the compressed digital control signal into one or more sub-streams using the map and sequence staggering configuration;
    transmit, to the QPU, the one or more sub-streams, wherein the sub-streams are transmitted with the one or more delays.

20. A non-transitory computer-readable medium comprising instructions which, when executed by a computing computer comprising a quantum processing unit (QPU) and a classical interface, cause the quantum computing apparatus to:
    receive, at a central processing unit (CPU) of the classical interface, a digital control signal describing a quantum circuit to be performed by the QPU;
    compress, at the CPU, the digital control signal using a preselected compression scheme;
    generate, at the CPU, a sequence staggering configuration indicating one or more delays to be applied to transmission of the compressed digital control signal and a map indicating a number of bits to be transmitted over each of the plurality of communication channels;
    output, from the CPU to a programable logic unit of the classical interface, the compressed digital control signal, the sequence staggering configuration and the map;
    split, at the programable logic unit, the compressed digital control signal into one or more sub-streams using the map and sequence staggering configuration; and,
    transmit, from the programable logic unit to the QPU, the one or more sub-streams, wherein the sub-streams are transmitted with the one or more delays.

* * * * *